(12) United States Patent
Tang et al.

(10) Patent No.: US 7,271,086 B2
(45) Date of Patent: Sep. 18, 2007

(54) MICROFEATURE WORKPIECES AND METHODS OF FORMING A REDISTRIBUTION LAYER ON MICROFEATURE WORKPIECES

(75) Inventors: Sanh D. Tang, Boise, ID (US); Troy Gugel, Boise, ID (US); John Lee, Boise, ID (US); Fred Fishburn, Woodbridge, VA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/218,254

(22) Filed: Sep. 1, 2005

(65) Prior Publication Data
US 2007/0045865 A1  Mar. 1, 2007

(51) Int. Cl.
*H01L 21/4763* (2006.01)

(52) U.S. Cl. .................. 438/620; 438/598; 438/599; 438/612; 438/618; 438/667; 257/E21.59; 257/E21.641

(58) Field of Classification Search ................ 438/637, 438/598, 599, 612, 618, 620, 667; 257/E21.59, 257/E21.641
See application file for complete search history.

(56) References Cited

U.S. PATENT DOCUMENTS

| | | | |
|---|---|---|---|
| 5,739,579 A * | 4/1998 | Chiang et al. ............... 257/635 |
| 5,766,829 A * | 6/1998 | Cathey et al. ............... 430/394 |
| 5,795,682 A * | 8/1998 | Garza ............................. 430/5 |
| 5,851,845 A | 12/1998 | Wood et al. |
| 5,933,713 A | 8/1999 | Farnworth |
| 5,946,553 A | 8/1999 | Wood et al. |
| 6,004,867 A | 12/1999 | Kim et al. |
| 6,008,070 A | 12/1999 | Farnworth |
| 6,020,624 A | 2/2000 | Wood et al. |
| 6,072,236 A | 6/2000 | Akram et al. |
| 6,124,634 A | 9/2000 | Akram et al. |
| 6,184,138 B1 * | 2/2001 | Ho et al. ..................... 438/687 |
| 6,184,465 B1 | 2/2001 | Corisis |
| 6,187,615 B1 | 2/2001 | Kim et al. |
| 6,228,687 B1 | 5/2001 | Akram et al. |
| 6,235,552 B1 | 5/2001 | Kwon et al. |
| 6,326,697 B1 | 12/2001 | Farnworth |
| 6,326,698 B1 | 12/2001 | Akram |
| 6,407,381 B1 | 6/2002 | Glenn et al. |
| 6,503,780 B1 | 1/2003 | Glenn et al. |
| 6,576,531 B2 | 6/2003 | Peng et al. |

(Continued)

OTHER PUBLICATIONS

U.S. Appl. No. 11/513,661, filed Aug. 30, 2006, Pratt.

*Primary Examiner*—Michelle Estrada
*Assistant Examiner*—Jarrett J Stark
(74) *Attorney, Agent, or Firm*—Perkins Coie LLP (57) ABSTRACT

Methods for forming a redistribution layer on microfeature workpieces, and microfeature workpieces having such a redistribution layer are disclosed herein. In one embodiment, a method includes constructing a dielectric structure on a microfeature workpiece having a substrate and a terminal carried by the substrate, and removing a section of the dielectric structure to form an opening. The opening has a first portion extending through the dielectric structure and exposing the terminal and a second portion extending to an intermediate depth in the dielectric structure. The second portion is spaced laterally apart from the terminal. The method further includes forming a conductive layer on the microfeature workpiece with the conductive layer in electrical contact with the terminal and disposed in the first and second portions of the opening.

31 Claims, 5 Drawing Sheets

U.S. PATENT DOCUMENTS

| | | |
|---|---|---|
| 7,115,998 B2 * | 10/2006 | Hiatt et al. .................. 257/773 |
| 2002/0037603 A1 * | 3/2002 | Eldridge et al. ............. 438/112 |
| 2004/0043675 A1 * | 3/2004 | Hiatt et al. .................. 439/894 |
| 2006/0001141 A1 * | 1/2006 | Hiatt et al. .................. 257/686 |
| 2006/0046461 A1 * | 3/2006 | Benson et al. ............... 438/612 |
| 2006/0115983 A1 * | 6/2006 | Fujii et al. ................... 438/640 |
| 2006/0151880 A1 | 7/2006 | Tang et al. |
| 2006/0252225 A1 | 11/2006 | Gambee et al. |

* cited by examiner

MICROFEATURE WORKPIECES AND METHODS OF FORMING A REDISTRIBUTION LAYER ON MICROFEATURE WORKPIECES

TECHNICAL FIELD

The present invention is directed to microfeature workpieces and methods of forming a redistribution layer on microfeature workpieces.

BACKGROUND

Conventional die-level packaged microelectronic devices include a microelectronic die, an interposer substrate or lead frame attached to the die, and a molded casing around the die. The die generally includes an integrated circuit and a plurality of bond-pads coupled to the integrated circuit. The bond-pads are typically coupled to terminals on the interposer substrate or lead frame and serve as external electrical contacts on the die through which supply voltage, signals, etc., are transmitted to and from the integrated circuit. In addition to the terminals, the interposer substrate also includes ball-pads coupled to the terminals by conductive traces supported in a dielectric material. Solder balls can be attached to the ball-pads in one-to-one correspondence to define a "ball-grid array." Packaged microelectronic devices with ball-grid arrays are generally higher grade packages having lower profiles and higher pin counts than conventional packages using lead frames.

One process for packaging a die with a ball-grid array at the die level includes (a) forming a plurality of dies on a semiconductor wafer, (b) cutting the wafer to separate or singulate the dies, (c) attaching individual dies to an interposer substrate, (d) wire-bonding the bond-pads of the dies to the terminals of the interposer substrate, and (e) encapsulating the dies with a suitable molding compound. Mounting individual dies to interposer substrates or lead frames in the foregoing manner can be a time-consuming and expensive process. In addition, forming robust wire-bonds that can withstand the forces involved in molding processes becomes more difficult as the demand for higher pin counts and smaller packages increases. Moreover, the process of attaching individual dies to interposer substrates or lead frames may damage the bare dies. These difficulties have made the packaging process a significant factor in the production of microelectronic devices.

Another process for packaging microelectronic devices is wafer-level packaging. In this process, a plurality of microelectronic dies are formed on a wafer, and then a redistribution layer is formed over the dies. The redistribution layer can include a dielectric layer and a plurality of exposed pads formed in arrays on the dielectric layer. Each pad array is typically arranged over a corresponding die, and the pads in each array are coupled to corresponding bond-pads of the die by conductive traces extending through the dielectric layer. After forming the redistribution layer on the wafer, discrete masses of solder paste can be deposited onto the individual pads. The solder paste is then reflowed to form small solder balls or "solder bumps" on the pads. After forming the solder balls, the wafer is singulated to separate the individual microelectronic devices from each other.

Wafer-level packaging is a promising development for increasing efficiency and reducing the cost of microelectronic devices. By "pre-packaging" individual dies with a redistribution layer before cutting the wafers to singulate the dies, sophisticated semiconductor processing techniques can be used to form smaller arrays of solder balls. Additionally, wafer-level packaging is an efficient process that simultaneously packages a plurality of dies, thereby reducing costs and increasing throughput.

Conventional processes of forming a redistribution layer on a wafer include (a) depositing first and second dielectric layers on the wafer, (b) patterning and developing the second dielectric layer to form holes over the bond-pads on the dies, (c) reaction ion etching the first dielectric layer to expose the bond-pads, (d) depositing a conductive layer across the wafer, (e) forming a resist on the conductive layer, (f) patterning and developing the resist, (g) etching the exposed sections of the conductive layer to form the pads, and (h) removing the resist from the wafer. One concern with forming a redistribution layer on a wafer is that conventional processes are relatively expensive because patterning the second dielectric layer requires a first mask and patterning the resist requires a second mask. Masks are expensive and time-consuming to construct because they require very expensive photolithography equipment to achieve the tolerances required in semiconductor devices. Accordingly, there is a need to reduce the cost of forming redistribution layers.

BRIEF DESCRIPTION OF THE DRAWINGS

FIGS. 1-5 illustrate stages of a method for forming a redistribution layer on a microfeature workpiece in accordance with one embodiment of the invention.

FIGS. 7 and 8 illustrate stages in a method for forming a redistribution layer on a microfeature workpiece in accordance with another embodiment of the invention.

DETAILED DESCRIPTION

A. Overview

The following disclosure describes several embodiments of methods for forming a redistribution layer on microfeature workpieces, and microfeature workpieces having such a redistribution layer. The microfeature workpieces typically have a substrate and a terminal carried by the substrate. An embodiment of one such method includes constructing a dielectric structure on a microfeature workpiece, and removing a section of the dielectric structure to form an opening. The opening has a first portion extending through the dielectric structure and exposing the terminal and a second portion extending to an intermediate depth in the dielectric structure. The second portion is spaced laterally apart from the terminal. The method further includes forming a conductive layer on the microfeature workpiece with the conductive layer in electrical contact with the terminal and disposed in the first and second portions of the opening.

In another embodiment, a method includes (a) providing a microfeature workpiece having a substrate, a terminal carried by the substrate, a first dielectric layer on the substrate, and a second dielectric layer on the first dielectric layer, and (b) selectively removing a first portion of the second dielectric layer to expose a section of the first dielectric layer over the terminal and selectively removing a second portion of the second dielectric layer adjacent to the first portion to form a recess with an intermediate depth in the second dielectric layer. The first and second portions are removed in a single process. For example, the second dielectric layer can be a photoactive layer, and the first and second portions can be removed by patterning and developing the photoactive second dielectric layer.

Another aspect of the invention is directed to microfeature workpieces. In one embodiment, a microfeature workpiece includes a substrate, a microelectronic die formed in and/or on the substrate, and a dielectric structure on the substrate. The die includes an integrated circuit and a terminal electrically coupled to the integrated circuit. The dielectric structure includes (a) a first surface facing the substrate, (b) a second surface opposite the first surface, and (c) an opening having a first portion aligned with the terminal and extending between the first and second surfaces and a second portion adjacent to the first portion and extending from the second surface to an intermediate depth. The workpiece further includes a conductive layer in the first and second portions of the opening and electrically coupled to the terminal.

Specific details of several embodiments of the invention are described below with reference to methods of forming a redistribution layer on a workpiece. Several details describing well-known structures or processes often associated with fabricating redistribution layers and/or microelectronic dies are not set forth in the following description for purposes of clarity. Also, several other embodiments of the invention can have different configurations, components, or procedures than those described in this section. A person of ordinary skill in the art, therefore, will accordingly understand that the invention may have other embodiments with additional elements, or the invention may have other embodiments without several of the elements shown and described below with reference to FIGS. 1-8. The term "microfeature workpiece" is used throughout to include substrates upon which and/or in which microelectronic devices, micromechanical devices, data storage elements, optics, and other features are fabricated. For example, microfeature workpieces can be semiconductor wafers, glass substrates, dielectric substrates, or many other types of substrates. Many features on such microfeature workpieces have critical dimensions less than or equal to 1 µm, and in many applications the critical dimensions of the smaller features are less than 0.25 µm or even less than 0.1 µm. Where the context permits, singular or plural terms may also include the plural or singular term, respectively. Moreover, unless the word "or" is expressly limited to mean only a single item exclusive from other items in reference to a list of at least two items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same features and/or types of other features and components are not precluded.

Figure 1:
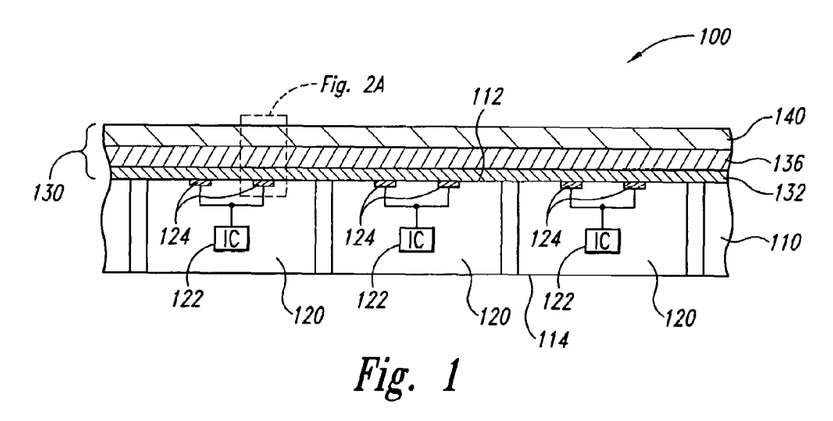
FIG. 1 is a schematic side cross-sectional view of a portion of the workpiece including a substrate, a plurality of microelectronic dies formed in and/or on the substrate, and a dielectric structure over the substrate.

B. Embodiments of Methods for Forming a Redistribution Layer on Microfeature Workpieces FIGS. 1-5 illustrate stages of a method for forming a redistribution layer on a microfeature workpiece 100 in accordance with one embodiment of the invention. FIG. 1, for example, is a schematic side cross-sectional view of a portion of the workpiece 100 including a substrate 110, a plurality of microelectronic dies 120 formed in and/or on the substrate 110, and a dielectric structure 130 on the substrate 110. The substrate 110 has a first side 112 and a second side 114 opposite the first side 112. The substrate 110 is generally a semiconductor wafer, and the dies 120 are arranged in a die pattern on the wafer. The individual dies 120 include integrated circuitry 122 (shown schematically) and a plurality of terminals 124 (e.g., bond-pads) electrically coupled to the integrated circuitry 122. Although the illustrated dies 120 have the same structure, in other embodiments, the dies 120 can have different features to perform different functions.

The illustrated dielectric structure 130 includes a first dielectric layer 132 applied over the first side 112 of the substrate 110, a second dielectric layer 136 applied over the first dielectric layer 132, and a third dielectric layer 140 applied over the second dielectric layer 136. In several applications, the first dielectric layer 132 can be an oxide passivation layer, and the second dielectric layer 136 can be a nitride passivation layer. For example, the first and second dielectric layers 132 and 136 can be parylene, a low-temperature chemical vapor deposition (low-temperature CVD) material such as silicon nitride ($Si_3N_4$), silicon oxide ($SiO_2$), and/or other suitable materials. The foregoing list of dielectric materials is not exhaustive. The first and second dielectric layers 132 and 136 are generally not composed of the same material as each other, but these layers may be composed of the same material. In addition, one or both of the first and second dielectric layers 132 and 136 may be omitted and/or additional layers may be included. The first and second dielectric layers 132 and 136 can have a combined thickness of approximately 0.5 microns to 4 microns, and these layers typically have a total thickness of approximately 1 micron to 1.5 microns. The third dielectric layer 140 can be a polymer or other suitable dielectric material for forming a permanent mask on the second dielectric layer 136. The third dielectric layer 140, for example, can be a 3-micron-thick layer of polyimide. In other embodiments, the third dielectric layer 140 can have a thickness greater than or less than 3 microns and/or be composed of a different photoactive material.

Figure 2A:
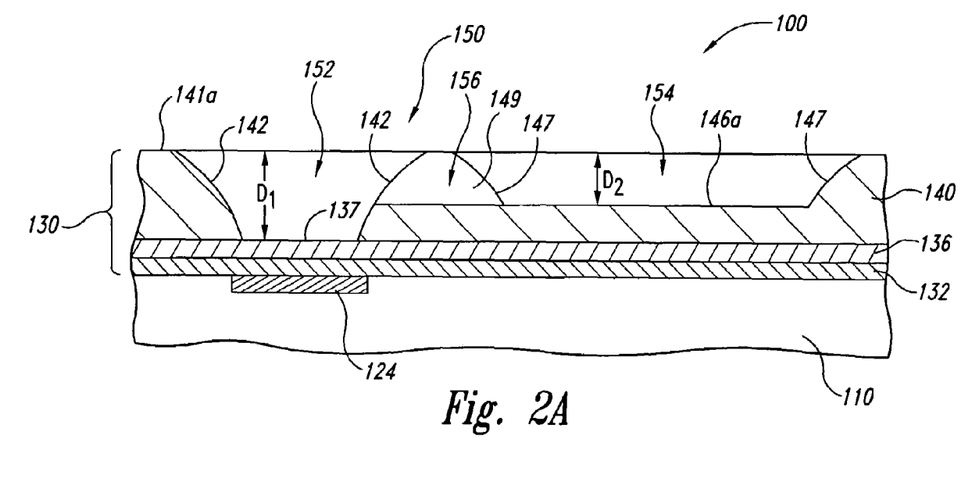
FIG. 2A is a schematic side cross-sectional view of the area 2A shown in FIG. 1 after patterning and developing a third dielectric layer.
Figure 2B:
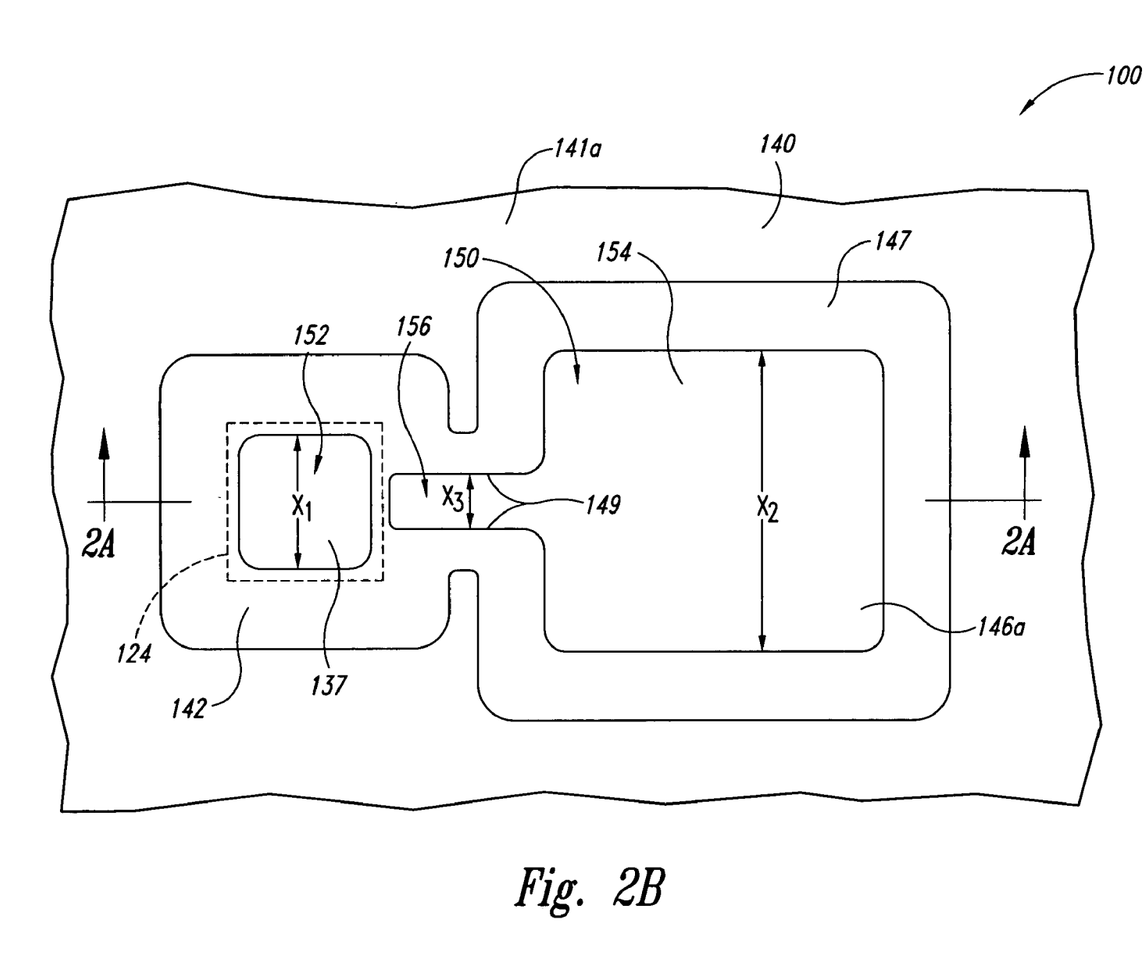
FIG. 2B is a top plan view of the portion of the workpiece illustrated in FIG. 2A.

FIG. 2A is a schematic side cross-sectional view of the area 2A shown in FIG. 1 after patterning and developing the third dielectric layer 140 to form a plurality of openings 150 (only one shown) at corresponding terminals 124. FIG. 2B is a top plan view of the portion of the workpiece 100 illustrated in FIG. 2A. Referring to both FIGS. 2A and 2B, the illustrated opening 150 includes a first portion 152 generally aligned with the terminal 124, a second portion 154 spaced apart laterally from the first portion 152, and a third portion 156 extending between the first and second portions 152 and 154. The first portion 152 is defined by a sidewall 142 and extends completely through the third dielectric layer 140 from a first surface 141a of the third dielectric layer 140 to a first surface 137 of the second dielectric layer 136. The first portion 152 accordingly has a first depth $D_1$ (FIG. 2A) and exposes a section of the second dielectric layer 136. The second portion 154 of the opening 150 is defined by a sidewall 147 and extends from the first surface 141a to a recessed surface 146a of the third dielectric layer 140 at an intermediate depth $D_2$ (FIG. 2A) less than the first depth $D_1$. The third portion 156 of the opening 150 also extends from the first surface 141a to the recessed surface 146a and is defined by sidewalls 149. Although the illustrated recessed surface 146a is generally planar and is oriented generally parallel to the first surface 141a, in other embodiments, the recessed surface may have a slope and/or be nonplanar. In the illustrated opening 150, the first portion 152 has a first lateral dimension $X_1$ (FIG. 2B), the second portion 154 has a second lateral dimension $X_2$ (FIG. 2B) greater than the first lateral dimension $X_1$, and the third portion 156 has a third lateral dimension $X_3$ (FIG. 2B) less than the first lateral dimension $X_1$. In additional embodiments, the opening 150 may not have the third portion 156, and/or the opening 150 can have a different configuration.

The first, second, and third portions 152, 154, and 156 of the opening 150 can be formed in a single development process. For example, in one embodiment, a phase-shift reticle or other suitable device can be used to pattern the third dielectric layer 140 and form exposed, underexposed, and unexposed portions. The exposed portion can be irradiated with a sufficient dose to activate all the material between the first and second surfaces 141a and 143 of the third dielectric layer 140. The underexposed portion can be irradiated with a dose selected so that only an upper section of the material in the third dielectric layer 140 is activated. During development, the exposed portion of the third dielectric layer 140 is removed to form the first portion 152 of the opening 150, and the underexposed portion of the third dielectric layer 140 is removed to form the second and third portions 154 and 156 of the opening 150.

In other embodiments, two or more masks can be used to pattern the third dielectric layer 140. For example, a first reticle can be used to expose a first section of the third dielectric layer 140 corresponding to the first portion 152 of the opening 150, and a second reticle can be used to expose a second section of the third dielectric layer 140 corresponding to the second and third portions 154 and 156 of the opening 150. The first section of the third dielectric layer 140 can be irradiated with a first dose to activate all the material between the first and second surfaces 141a and 143 of the third dielectric layer 140, and the second section of the third dielectric layer 140 can be irradiated with a second dose less than the first dose to activate only an upper portion of the material in the third dielectric layer 140. After exposing the first and second sections, the third dielectric layer 140 can be developed to remove the exposed material and form the opening 150. In additional embodiments, the third dielectric layer 140 can be patterned using optical proximity correction (OPC) techniques, or other suitable methods, to form the opening 150.

Figure 3:
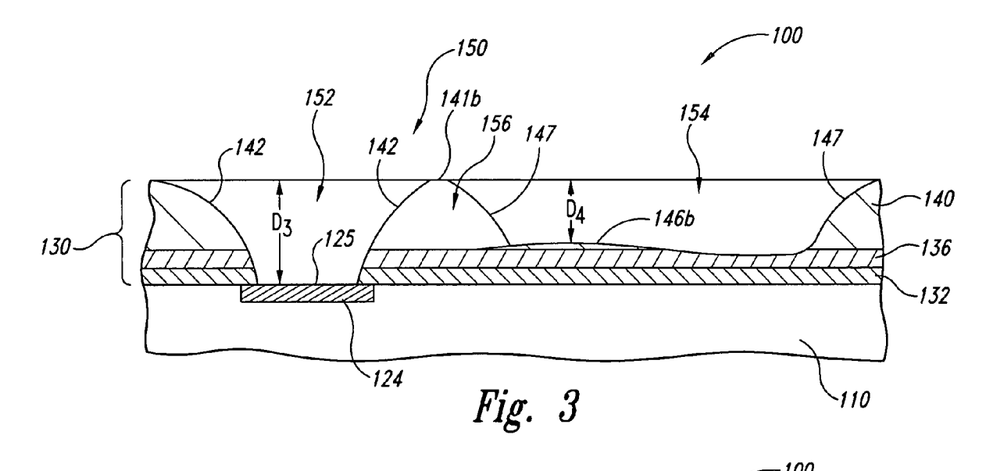
FIG. 3 is a schematic side cross-sectional view of the portion of the workpiece illustrated in FIG. 2A after removing additional material from the dielectric structure.

FIG. 3 is a schematic side cross-sectional view of the portion of the workpiece 100 illustrated in FIG. 2A after removing additional material from the dielectric structure 130. After patterning and developing the third dielectric layer 140, the workpiece 100 can be heated to at least partially cure the third dielectric layer 140. For example, in several embodiments, the workpiece 100 can be heated at 300° C. to 375° C. for 30 minutes to 30 hours. In other embodiments, however, the workpiece 100 can be heated to a different temperature and/or for a different period of time. Alternatively, the workpiece 100 may not be heated after patterning and developing the third dielectric layer 140.

In the illustrated embodiment, after heating the workpiece 100, additional material is removed from the dielectric structure 130 by reaction ion etching (RIE) or other suitable processes to extend the first, second, and third portions 152, 154, and 156 of the opening 150 toward the substrate 110. Specifically, a section of the first and second dielectric layers 132 and 136 is removed to expose the terminal 124 and extend the first portion 152 of the opening 150 from a first surface 141b of the third dielectric layer 140 to a surface 125 of the terminal 124. Moreover, a different section of the dielectric structure 130 is removed to extend the second and third portions 154 and 156 of the opening 150 from the first surface 141b to a recessed surface 146b. The illustrated recessed surface 146b is generally planar and is oriented generally parallel to the first surface 141b. Although the illustrated recessed surface 146b is formed partially in the second dielectric layer 136 and partially in the third dielectric layer 140, in other embodiments, the recessed surface 146b can be formed in the first, second, and/or third dielectric layers 132, 136, and/or 140 depending on the volume of material removed from the dielectric structure 130. In either case, the first portion 152 of the opening 150 has a third depth $D_3$, and the second and third portions 154 and 156 of the opening 150 have a fourth, intermediate depth $D_4$ less than the third depth $D_3$. In several applications, the third depth $D_3$ can be approximately 5 microns, and the fourth, intermediate depth $D_4$ can be approximately 3.5 microns. In other embodiments, the first, second, and/or third portions 152, 154, and/or 156 can have different depths.

Figure 4:
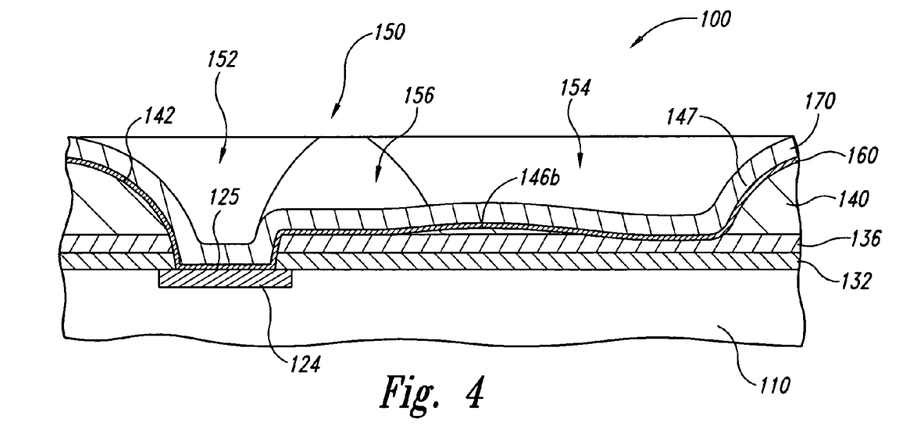
FIG. 4 is a schematic side cross-sectional view of the portion of the workpiece illustrated in FIG. 3 after depositing a barrier layer onto the workpiece and forming a conductive layer on the barrier layer.

FIG. 4 is a schematic side cross-sectional view of the portion of the workpiece 100 illustrated in FIG. 3 after depositing a barrier layer 160 onto the workpiece 100 and forming a conductive layer 170 on the barrier layer 160. The barrier layer 160 generally covers the exposed surface of the workpiece 100 including the exposed sections of the first, second, and third dielectric layers 132, 136, and 140 and the exposed surface 125 of the terminal 124. In one embodiment, for example, the barrier layer 160 is a layer of Ta that is deposited onto the workpiece 100 using physical vapor deposition (PVD). The thickness of the barrier layer 160 can be about 150 Å. In other embodiments, the barrier layer 160 may be deposited onto the workpiece 100 using other vapor deposition processes, such as CVD, and/or may have a different thickness. The barrier layer 160 is not limited to Ta, but rather may be composed of TaN, TiN, WNx, or other suitable materials to help contain the conductive layer 170 subsequently deposited onto the workpiece 100.

After forming the barrier layer 160, the conductive layer 170 is deposited onto the barrier layer 160 across the workpiece 100. In one embodiment, the conductive layer 170 is a layer of Al having a thickness of between 1 micron and 1.5 microns. In other embodiments, such as the embodiment described below with reference to FIGS. 6 and 8, the conductive layer 170 can have a different thickness and/or be comprised of a different material such as Cu.

Figure 5:
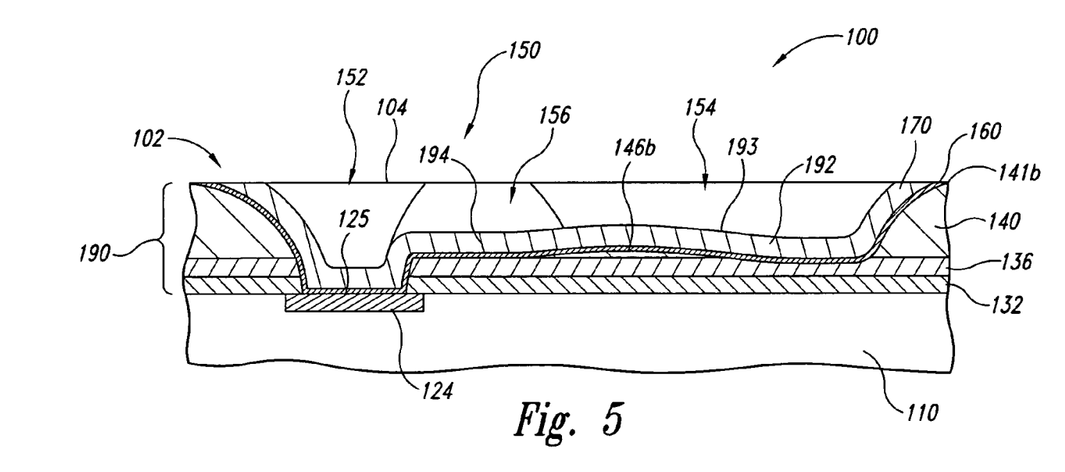
FIG. 5 is a schematic side cross-sectional view of the portion of the workpiece illustrated in FIG. 4 after planarizing the workpiece.

FIG. 5 is a schematic side cross-sectional view of the portion of the workpiece 100 illustrated in FIG. 4 after planarizing the workpiece 100. After forming the conductive layer 170, a first side 102 of the workpiece 100 is planarized to remove the barrier layer 160 and the conductive layer 170 from the first surface 141b of the third dielectric layer 140, and leave only the sections of the conductive layer 170 disposed in the openings 150. Because the portion of the conductive layer 170 between the openings 150 is removed, the sections of the conductive layer 170 in each opening 150 are electrically isolated from each other.

The dielectric structure 130 and the sections of the conductive layer 170 disposed in the openings 150 form a redistribution layer 190 on the workpiece 100. Specifically, the section of the conductive layer 170 disposed in the second portion 154 of the opening 150 forms a pad 192, and the section of the conductive layer 170 disposed in the first and third portions 152 and 156 of the opening 150 forms a trace 194 electrically coupling the pad 192 to the terminal 124. The illustrated pad 192 has a generally planar surface 193 configured to receive a bump, conductive coupler (e.g., solder ball), and/or end of a wire-bond. Moreover, although the illustrated pad 192 is recessed from a surface 104 of the workpiece 100, in other embodiments, such as the embodiment described below with reference to FIG. 6, the pad is not recessed from the surface 104.

One feature of the method illustrated in FIGS. 1-5 is that the redistribution layer 190 can be formed on the workpiece 100 with a single patterning process and a single developing process. An advantage of this feature is that the illustrated method reduces the number of expensive and time-consuming patterning and developing processes performed while constructing a redistribution layer on a workpiece. By contrast, conventional methods of forming redistribution layers require multiple patterning processes and multiple development processes. Moreover, another advantage of the method illustrated in FIGS. 1-5 is that the process can be easily adapted to accommodate dies with different sizes. For example, the size of the openings 150 can be easily changed to form the pads 192 of the redistribution layer 190 closer to or further away from the corresponding terminals 124.

Figure 6:
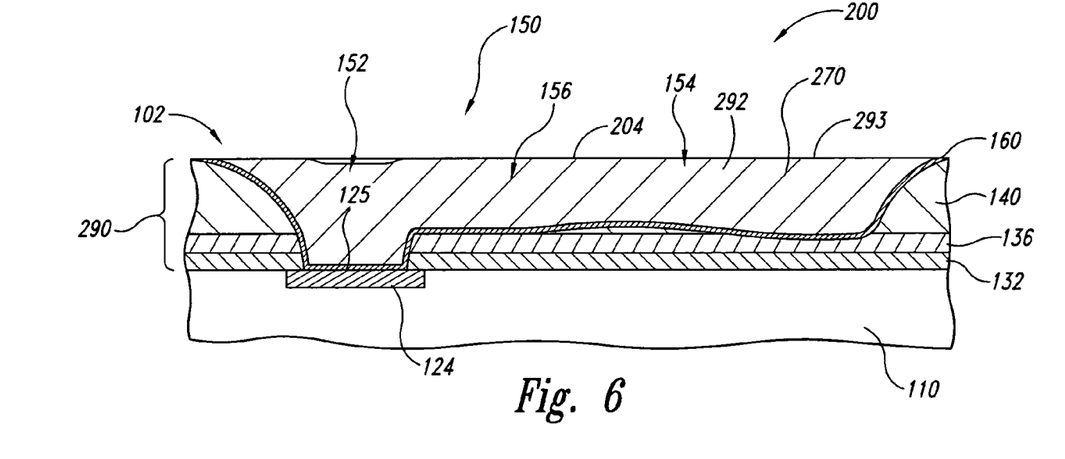
FIG. 6 is a schematic side cross-sectional view of a portion of a workpiece in accordance with another embodiment of the invention.

C. Additional Embodiments of Methods for Forming a Redistribution Layer on Microfeature Workpieces FIG. 6 is a schematic side cross-sectional view of a portion of a workpiece 200 in accordance with another embodiment of the invention. The illustrated workpiece 200 is generally similar to the workpiece 100 described above with reference to FIGS. 1-5. The illustrated workpiece 200, however, includes a thicker conductive layer 270 that fills the second and third portions 154 and 156 of the opening 150. The thicker conductive layer 270 can be formed by depositing Al, Cu, or other suitable conductive materials onto the workpiece 200. Because of the thickness of the conductive layer 270, the workpiece 200 includes a redistribution layer 290 having a plurality of pads 292 with a surface 293 that is generally coplanar with a surface 204 of the workpiece 200.

Figure 7:
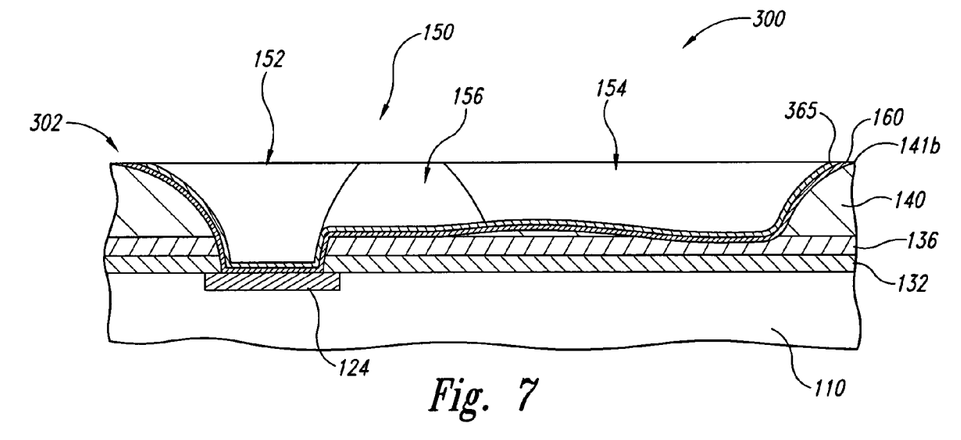
FIG. 7 is a schematic side cross-sectional view of a portion of a microfeature workpiece.
Figure 8:
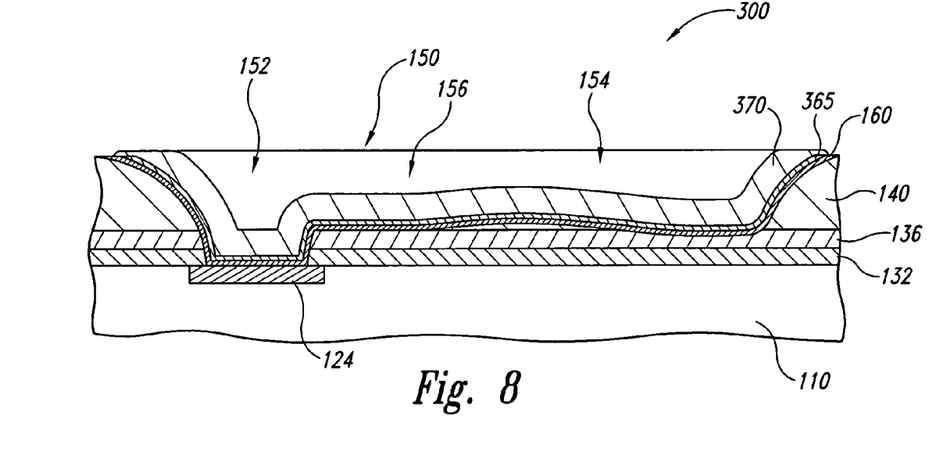
FIG. 8 is a schematic side cross-sectional view of the workpiece illustrated in FIG. 7 after forming a conductive layer.

FIGS. 7 and 8 illustrate stages in a method for forming a redistribution layer on a microfeature workpiece in accordance with another embodiment of the invention. FIG. 7, for example, is a schematic side cross-sectional view of a portion of a workpiece 300 generally similar to the workpiece 100 described above with reference to FIG. 4. For example, the illustrated workpiece 300 includes an opening 150 having a first portion 152, a second portion 154 spaced apart laterally from the first portion 152, and a third portion 156 extending between the first and second portions 152 and 154. The illustrated workpiece 300, however, includes a seed layer 365 on the barrier layer 160. The seed layer 365 can be deposited using vapor deposition techniques, such as PVD, CVD, and/or atomic layer deposition (ALD). The seed layer 365 can be composed of Cu or other suitable materials. The thickness of the seed layer 365 may be about 2000 Å, but can be more or less depending on the depth of the opening 150. After forming the barrier layer 160 and the seed layer 365 on the workpiece 300, a first side 302 of the workpiece 300 is planarized to remove the barrier layer 160 and the seed layer 365 from the first surface 141b of the third dielectric layer 140 and leave only the sections of the seed layer 365 disposed in the openings 150.

FIG. 8 is a schematic side cross-sectional view of the workpiece 300 after forming a conductive layer 370 on the seed layer 365 by electroless plating, electroplating, or another suitable methods. The conductive layer 370 can be comprised of Ni/Au or other suitable conductive materials. One feature of the method illustrated in FIGS. 7 and 8 is that the workpiece 300 is planarized to remove the portion of the seed layer 365 between the openings 150 before plating the conductive layer 370 onto the workpiece 300. An advantage of this feature is that the conductive material plates only onto the seed layer 365 in the openings 150 and not across the entire surface of the workpiece 300, which reduces the material costs.

From the foregoing, it will be appreciated that specific embodiments of the invention have been described herein for purposes of illustration, but that various modifications may be made without deviating from the spirit and scope of the invention. For example, many of the elements of one embodiment can be combined with other embodiments in addition to or in lieu of the elements of the other embodiments. Accordingly, the invention is not limited except as by the appended claims.

We claim:

1. A method of forming a redistribution layer on a microfeature workpiece, the microfeature workpiece including a substrate and a terminal carried by the substrate, the method comprising:

constructing a dielectric structure on the microfeature workpiece;

exposing the constructed dielectric structure to a dosage of radiation;

controlling the dosage of radiation to form an opening having a first portion extending through the dielectric structure exposing the terminal and a second portion extending to an intermediate depth in the dielectric structure, wherein the second portion is spaced laterally apart from the terminal in a portion of a redistribution array; and forming a conductive layer on the microfeature workpiece with the conductive layer in electrical contact with the terminal and disposed in the first and second portions of the opening.

2. The method of claim 1 wherein:

constructing the dielectric structure on the microfeature workpiece comprises (a) depositing a first layer onto the workpiece, and (b) placing a photoactive layer on the first layer;

controlling the dosage of radiation comprises (a) irradiating the photoactive layer to form an exposed portion generally aligned with the terminal with a first dosage, an underexposed portion adjacent to the exposed portion with a second dosage smaller than the first dosage, and an unexposed portion with a third dosage smaller than both the first and second dosages, (b) developing the photoactive layer to remove the exposed portion and a section of the underexposed portion, and (c) etching the first layer after developing the photoactive layer;

the dielectric structure comprises a first surface facing the substrate and a second surface opposite the first surface;

forming the conductive layer comprises applying a conductive material across the second surface of the dielectric structure and in the first and second portions of the opening; and the method further comprises planarizing the microfeature workpiece to remove the conductive material from the second surface of the dielectric structure and leave a section of conductive material in the first and second portions of the opening.

3. The method of claim 1 wherein constructing the dielectric structure on the microfeature workpiece comprises depositing a photoactive layer onto the workpiece.

4. The method of claim 1 wherein:
constructing the dielectric structure on the microfeature workpiece comprises (a) depositing a first layer onto the workpiece, and (b) placing a photoactive layer on the first layer; and
controlling the dosage of radiation comprises (a) irradiating the photoactive layer to form an exposed portion generally aligned with the terminal with a first dosage, an underexposed portion adjacent to the exposed portion with a second dosage smaller than the first dosage, and an unexposed portion with a third dosage smaller than both the first and second dosages, and (b) developing the photoactive layer to remove the exposed portion and a section of the underexposed portion.

5. The method of claim 1 wherein:
constructing the dielectric structure on the microfeature workpiece comprises (a) depositing a first layer onto the workpiece, and (b) placing a photoactive layer on the first layer; and
controlling the dosage of radiation comprises (a) irradiating the photoactive layer to form an exposed portion generally aligned with the terminal with a first dosage, an underexposed portion adjacent to the exposed portion with a second dosage smaller than the first dosage, and an unexposed portion with a third dosage smaller than both the first and second dosages, (b) developing the photoactive layer to remove the exposed portion and a section of the underexposed portion, and (c) etching the first layer after developing the photoactive layer.

6. The method of claim 1 wherein removing the section of the dielectric structure comprises etching the dielectric structure to at least partially form the opening.

7. The method of claim 1 wherein forming the conductive layer comprises depositing a conductive material across the microfeature workpiece.

8. The method of claim 1 wherein forming the conductive layer comprises plating a conductive material onto the microfeature workpiece.

9. The method of claim 1 wherein:
the dielectric structure comprises a first surface facing the substrate and a second surface opposite the first surface;
forming the conductive layer comprises applying a conductive material across the second surface of the dielectric structure and in the first and second portions of the opening; and
the method further comprises planarizing the microfeature workpiece to remove the conductive material from the second surface of the dielectric structure.

10. The method of claim 1 wherein:
the dielectric structure comprises a first surface facing the substrate and a second surface opposite the first surface; and
forming the conductive layer comprises placing conductive material in the first and second portions of the opening such that a section of the conductive layer in the first and second portions is recessed from the second surface of the dielectric structure.

11. The method of claim 1 wherein:
the dielectric structure comprises a first surface facing the substrate and a second surface opposite the first surface;
the method further comprises (a) forming a seed layer across the microfeature workpiece, and (b) planarizing the microfeature workpiece to remove a first section of the seed layer positioned on the second surface of the dielectric structure; and
forming the conductive layer comprises plating a conductive material onto a second section of the seed layer in the first and second portions of the opening.

12. The method of claim 1 wherein:
constructing the dielectric structure comprises (a) depositing a first dielectric layer onto the substrate, and (b) forming a second dielectric layer on the first dielectric layer; and controlling the dosage of radiation comprises (a) irradiating a first portion of the second dielectric layer with a first dosage to expose a section of the first dielectric layer over the terminal, and (b) irradiating a second portion of the second dielectric layer adjacent to the first portion with a second dosage smaller than the first dosage to form a recess with an intermediate depth in the second dielectric layer in a single.

13. The method of claim 1 wherein:
the dielectric structure comprises a first surface facing the substrate and a second surface opposite the first surface; and
controlling the dosage of radiation comprises forming the opening such that the second portion defines a recessed surface oriented generally parallel to the second surface.

14. The method of claim 1 wherein controlling the dosage of radiation comprises forming the opening such that the first and second portions are spaced apart from each other laterally.

15. The method of claim 1 wherein:
controlling the dosage of radiation further comprises forming a third portion of the opening extending between the first and second portions; and
the third portion has a first lateral dimension and the second portion has a second lateral dimension greater than the first dimension.

16. The method of claim 1 wherein:
the dielectric structure comprises a first surface facing the substrate and a second surface opposite the first surface; and
forming the conductive layer comprises placing a conductive material in the first and second portions of the opening such that a surface of the conductive material in the second portion is generally coplanar with the second surface of the dielectric structure.

17. A method of forming a redistribution layer on a microfeature workpiece, comprising:
providing a microfeature workpiece including a substrate, a terminal carried by the substrate, a first dielectric layer on the substrate, and a second dielectric layer on the first dielectric layer; and exposing the second dielectric layer to a dosage of radiation;

controlling the dosage of radiation to selectively remove a first portion of the second dielectric layer to expose a section of the first dielectric layer over the terminal and selectively removing a second portion of the second dielectric layer adjacent to the first portion to form a recess with an intermediate depth in the second dielectric layer in a single process.

18. The method of claim 17 wherein:

the second dielectric layer comprises a photoactive layer; and controlling the dosage of radiation comprises (a) selectively irradiating the photoactive layer with different dosages to form an exposed portion generally aligned with the terminal, an underexposed portion adjacent to the exposed portion, and an unexposed portion, and (b) developing the photoactive layer to remove the exposed portion and a section of the underexposed portion.

19. The method of claim 17 wherein:

the second dielectric layer comprises a photoactive layer; and controlling the dosage of radiation comprises (a) patterning the photoactive layer to form an exposed portion generally aligned with the terminal, an underexposed portion adjacent to the exposed portion, and an unexposed portion, and (b) developing the photoactive layer to remove the exposed portion and a section of the underexposed portion.

20. The method of claim 17 wherein:

the second dielectric layer comprises a photoactive layer; and controlling the dosage of radiation comprises (a) patterning the photoactive layer to form an exposed portion generally aligned with the terminal, (b) patterning the photoactive layer to form an underexposed portion adjacent to the exposed portion, and (c) developing the photoactive layer to remove the exposed portion and a section of the underexposed portion.

21. The method of claim 17 wherein:

the second dielectric layer comprises a photoactive layer;

controlling the dosage of radiation comprises (a) selectively irradiating the photoactive layer to form an exposed portion generally aligned with the terminal, an underexposed portion adjacent to the exposed portion, and an unexposed portion, and (b) developing the photoactive layer to remove the exposed portion and a section of the underexposed portion; and the method further comprises etching the first dielectric layer to expose the terminal.

22. The method of claim 17 wherein controlling the dosage of radiation comprises forming a single opening in the second dielectric layer.

23. The method of claim 17, further comprising:

removing the section of the first dielectric layer over the terminal; and forming a conductive layer on the microfeature workpiece.

24. The method of claim 17 wherein the second dielectric layer comprises a first surface facing the first dielectric layer and a second surface opposite the first surface, and wherein the method further comprises:

removing the section of the first dielectric layer over the terminal;

forming a conductive layer across the second surface of the second dielectric layer; and planarizing the microfeature workpiece to remove the conductive layer from the second surface of the second dielectric layer.

25. The method of claim 17 wherein:

the second dielectric layer comprises a first surface facing the first dielectric layer and a second surface opposite the first surface; and selectively removing the second portion comprises forming a recessed surface in the second dielectric layer generally parallel to the second surface.

26. A method of forming a redistribution layer on a microfeature workpiece, the microfeature workpiece including a substrate, a terminal carried by the substrate, a dielectric layer on the substrate, and a photoactive layer on the dielectric layer, the method comprising:

irradiating the photoactive layer on the microfeature workpiece;

controlling intensity of the irradiation to selectively form an exposed portion generally aligned with the terminal, an underexposed portion adjacent to the exposed portion, and an unexposed portion; and developing the photoactive layer to remove the exposed portion and a section of the underexposed portion such that the developed photoactive layer has an opening with a first portion formed by removing the exposed portion and a second portion formed by removing the section of the underexposed portion, wherein the first portion of the opening is aligned with the terminal and extends completely through the photoactive layer, and wherein the second portion extends to an intermediate depth in the photoactive layer.

27. The method of claim 26 wherein controlling intensity of the irradiation comprises patterning the photoactive layer to form the exposed portion, the underexposed portion adjacent to the exposed portion, and the unexposed portion.

28. The method of claim 26 wherein controlling intensity of the irradiation comprises:

patterning the photoactive layer to form the exposed portion; and separately patterning the photoactive layer to form the underexposed portion.

29. The method of claim 26, further comprising etching the dielectric layer to expose the terminal.

30. The method of claim 26, further comprising:

removing a section of the dielectric layer to expose the terminal; and forming a conductive layer on the microfeature workpiece and in the opening.

31. The method of claim 26 wherein the photoactive layer comprises a first surface facing the dielectric layer and a second surface opposite the first surface, and wherein the method further comprises:

removing a section of the dielectric layer to expose the terminal;

forming a conductive layer across the microfeature workpiece and in the opening; and planarizing the microfeature workpiece to remove the conductive layer from the second surface of the photoactive layer.

* * * * *

UNITED STATES PATENT AND TRADEMARK OFFICE
CERTIFICATE OF CORRECTION

PATENT NO. : 7,271,086 B2 Page 1 of 1
APPLICATION NO. : 11/218254
DATED : September 18, 2007
INVENTOR(S) : Tang et al.

It is certified that error appears in the above-identified patent and that said Letters Patent is hereby corrected as shown below:

In column 10, line 33, in Claim 12, delete "single." and insert -- single step. --, therefor.

Signed and Sealed this

Twenty-seventh Day of November, 2007

JON W. DUDAS
*Director of the United States Patent and Trademark Office*